United States Patent
Zarbock et al.

(10) Patent No.: US 7,588,968 B1
(45) Date of Patent: Sep. 15, 2009

(54) LINKED CHIP ATTACH AND UNDERFILL

(75) Inventors: Edward A Zarbock, Gilbert, AZ (US); Ming Lei, Chandler, AZ (US); Sabina Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/059,047

(22) Filed: Mar. 31, 2008

(51) Int. Cl.
  *H01L 21/48* (2006.01)
(52) U.S. Cl. .............. 438/127; 438/108; 257/E21.503
(58) Field of Classification Search .......... None
  See application file for complete search history.

(56) References Cited

U.S. PATENT DOCUMENTS

| 6,902,954 B2 | 6/2005 | Shi |
| 2005/0121762 A1 | 6/2005 | Shi |
| 2006/0175710 A1 * | 8/2006 | Xie .......................... 257/778 |
| 2006/0290008 A1 * | 12/2006 | Fortin et al. ................ 257/779 |
| 2009/0045507 A1 * | 2/2009 | Pendse et al. ............... 257/734 |

* cited by examiner

*Primary Examiner*—Scott B. Geyer
*Assistant Examiner*—Whitney Moore
(74) *Attorney, Agent, or Firm*—Joseph P. Curtin; Cool Patent, P.C.

(57) ABSTRACT

A method for attaching an integrated circuit chip to a package substrate includes placing the integrated circuit onto the package substrate, and performing reflow to attach the integrated circuit to the package substrate. The temperature of the integrated circuit and package assembly is maintained at or above a predetermined temperature prior to dispensing an underfill between the package substrate and the integrated circuit. An underfill material is dispensed between the package substrate and the integrated circuit. The underfill material is cured to a first level of curing in the integrated circuit and package assembly. The underfill material is cooled in the integrated circuit and package assembly, and the underfill material is cured to a second level of curing in which the second level of curing is greater than the first level of curing.

9 Claims, 3 Drawing Sheets

LINKED CHIP ATTACH AND UNDERFILL

BACKGROUND

Integrated circuit (IC) dice tend to be fragile and are typically packaged for protection from physical damage and for heat dissipation. ICs may comprise one or more passive and/or active elements, one or more layers of metal interconnects and one or more layers of dielectric material. The dielectric layer formed between metal interconnects may be referred to as "inner layer dielectric" (ILD). An IC die and package are typically electrically interconnected via a first level interconnect (FLI) such as, for instance, by wirebonding or soldering.

During package assembly an IC die and package may be exposed to repeated thermal cycles which may induce thermomechanical stress on the ILD and solder joints. For instance, package assembly may include die placement at room temperature, solder reflow in the range of 220 degrees Celsius (° C.), cooling again to room temperature, deflux performed in the range of 90° C., prebake performed in the range of 160° C., underfill dispense performed in the range of 110° C., cooling again to room temperature and then underfill cure performed in the range of 160° C.

Other factors in the packaging process may cause additional temperature fluctuations. For instance, various stages of the assembly process take place in different pieces of assembly equipment. While being transferred on the line or off the line from one assembly apparatus to another, an IC/package assembly may cool significantly. Also, there may be downtime on the line caused by underfill bottlenecking, assist or material replenishment or lot changeover. In the event of downtime on the line, an IC/package assembly may cool while waiting for the line to return to function. Multiple thermal cycles with temperature fluctuations ranging to about 200° C. may have deleterious effects on ILD and solder joints due in part to coefficient of thermal expansion (CTE) mismatch between the IC and the package substrate.

Thermomechanical stresses during packaging may exceed the effective strength of ILD and solder joints which may result in ILD and solder joint cracking. Such defects may cause IC failures. Further, due to a constant drive to reduce die size and improve performance, FLI solder bump pitches and diameters are decreasing. To improve electrical performance, manufacturers are increasingly using low dielectric constant (low k) materials in ICs which tend to be weaker than previously used ILD materials. Both trends may further reduce solder joint and underlying ILD strength increasing the damaging effects of CTE mismatch during packaging.

DETAILED DESCRIPTION

In the following detailed description, numerous specific details are set forth in order to provide a thorough understanding of claimed subject matter. However, it will be understood by those skilled in the art that claimed subject matter may be practiced without these specific details. In other instances, well-known methods, procedures, and components have not been described in detail so as not to obscure claimed subject matter.

Throughout the following disclosure the term "integrated circuit" is used and is intended to refer to a discrete set of electronic components and interconnections patterned in and/or on a semiconductor die. The term "die" is used throughout the disclosure and is intended to refer to an integrated circuit. The term "interconnect" is used throughout the following disclosure and is intended to refer to a physical and/or electrical connection between connected items. The term "flip chip" is used throughout the following disclosure and is intended to refer to an integrated circuit, designed for a face-up or face-down direct interconnection with an underlying electrical component. The term "package" is used throughout the disclosure and is intended to refer to materials and components for encapsulating and interconnecting a die to a printed circuit board. The terms "solder" and "solder material" are used throughout the following disclosure and are intended to refer to materials such as pure metal or metal alloy used to bond other metals together. The term "reflow" is used throughout the following disclosure and is intended to refer to a process of heating and melting thermal interface and/or solder material to facilitate physical, thermal and/or electrical interconnection between parts to be coupled via a thermal interface and/or solder material.

The following detailed description discloses example embodiments of arrangements to package a single IC and substrate using an controlled collapse chip connection (C4), however, the following disclosure contemplates use with other types of integrated circuit mounting and package technologies, such as multiple integrated circuit stack-ups and/or with other types of mounting and packaging technologies. In addition, embodiments of the invention are applicable to a variety of package and substrate materials including organic, ceramic, and flex packages.

Figure 1:
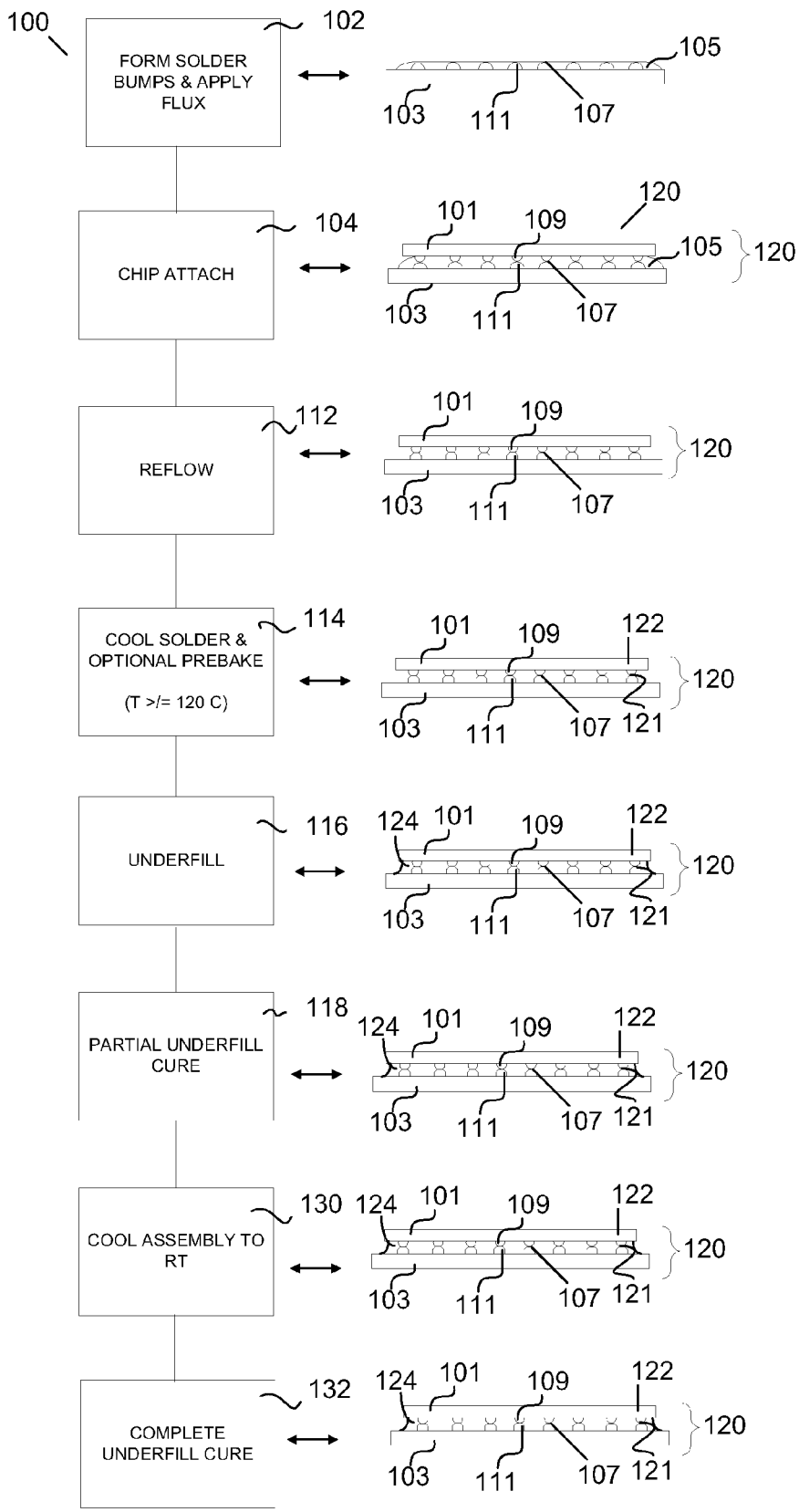
FIG. 1 is a block diagram depicting a particular embodiment of a process for attaching an IC to a package substrate.

FIG. 1 is a block diagram depicting a particular embodiment of a process 100 for attaching an IC 101 to a package substrate 103 via an FLI 107. Each block is accompanied by a cross-sectional illustration of an IC/package assembly 120. Process 100 refers to a controlled collapse chip connection (C4) packaging technique, however, it will be recognized by one of ordinary skill in the art that process 100 may be adapted to other packaging techniques interconnecting one or more ICs and/or substrates, such as, for instance in a multichip stack up and/or other package board assemblies.

In a particular embodiment, process 100 may begin at block 102 wherein solder may be applied to bond pads (not shown) on the first surface of substrate 103. According to another particular embodiment, solder may be applied to bond pads of IC 101 as well and claimed subject matter is not limited in this regard. The solder may be applied using any number of suitable techniques such as, for instance, printing, vapor deposition and/or electroplating and claimed subject matter is not limited in this regard. After the solder is applied, substrate 103 may be heated to beyond the solder's melting point to reflow the solder and to facilitate wetting of the bond pads to form solder bumps 111.

In a particular embodiment, a flux material, such as, for instance, no-clean flux 105 may be applied over a first surface of substrate 103 substantially encapsulating solder bumps 111. No-clean flux 105 may comprise any of a variety of commercially availably or custom no-clean fluxes, such as, for instance, "No-Clean Flip Chip Flux ICA-1127-47" available from Indium Corporation, Utica, N.Y., United States "Kester 245 No-Clean Flux" available from Kester Company, Itasca, Ill., United States and/or "No-Clean Flux NS-316" available from Nihon Superior Company, Suita City, Osaka, Japan and claimed subject matter is not limited in this regard. According to a particular embodiment, use of no-clean flux 105 may eliminate at least one thermal cycle from process 100. In a particular embodiment, no-clean flux 105 may have a boiling point below the melting point of solder bumps 111 enabling no-clean flux 105 to be substantially volatilized during die attach reflow. Accordingly, no-clean flux 105 may leave little or no residue on assembly 120 after reflow thus eliminating the need for a later de-flux stage. In a particular embodiment, because no-clean flux 105 may leave behind substantially no residue, a de-flux stage may be removed from process 100.

In conventional package assembly, if a flux material leaves behind residue, the residue may be removed during a de-flux stage. De-flux generally requires assembly 120 to be cooled from a reflow temperature of about 220° C. to about room temperature. During de-flux pressurized deionized water at about 90° C. is sprayed between IC 101 and substrate 103 to remove flux residue. Then IC 101 is cooled again to about room temperature. Additionally, a de-flux stage may leave excess moisture that should be removed before underfill. After de-flux, assembly 120 is typically prebaked at about 160° C. to remove excess moisture left behind by de-flux processing. Thus, use of no-clean flux 105 in process 100 may enable eliminating two thermal cycles from process 100 by eliminating a thermal cycle associated with de-flux itself and eliminating thermal cycling of a prebake stage involved with by a de-flux stage.

According to a particular embodiment, no-clean flux 105 may be held at a flux activation temperature for an extended duration. For instance, assembly 120 may be held at about 140° C. for about 100 seconds. Such an extended duration at an activation temperature may be referred to as "Long FAT". In a particular embodiment, Long FAT processing may enable flux carriers to volatilize in a controlled manner substantially reducing IC/substrate misalignment. However, this is merely an example of a method of holding no-clean flux for an extended duration at the activation temperature and claimed subject matter is not so limited. For instance, in another particular embodiment, other flux activation temperatures and holding times may be appropriate.

In a particular embodiment, process 100 may proceed to block 104 wherein IC 101 may be attached to a substrate 103 via compression, adhesion and/or thermocompression or any number of other suitable techniques known to those of skill in the art. In a particular embodiment, metal bumps 109 and solder bumps 111 may be aligned and heat and/or pressure may be applied to IC/substrate assembly 120 to hold the IC 101 and substrate 103 together prior to reflow. In a particular embodiment, a flux material such as, for instance, no-clean flux 105 may facilitate adhesion between IC 101 and substrate 103.

In a particular embodiment, process 100 may proceed to block 112 where IC 101 and substrate 103 may be electrically connected via solder reflow. In a particular embodiment, during reflow, solder bumps 111 may be heated to their melting point and joined to metal bumps 109 by soldering. According to a particular embodiment, heat may be applied to solder bumps 111 by a variety of methods such as, for instance, by a heated gas flow, electrical pulse heating and/or direct heat applied via an internal or external heating element and claimed subject matter is not limited in this regard. According to a particular embodiment, solder bumps 111 may melt at temperatures in the range of 220° C. However, this is merely an example of a solder reflow method and reflow temperature and claimed subject matter is not so limited.

In a particular embodiment, process 100 may proceed to block 114 where assembly 120 may be cooled to about 120° C. and optionally prebaked at a temperature in the range of about 160° C. As previously noted, the use of no-clean flux 105 during reflow enables elimination of a deflux stage of process 100. Accordingly, without the temperature fluctuation of a deflux step, assembly 120 may be kept at a temperature above about 120° C. after reflow, during an optional prebake stage and before transfer to an underfill station. In contrast to conventional methods, maintaining the temperature at or above 120° C. may reduce the temperature fluctuation at this stage of process 100 from having a temperature change ($\Delta$) of about 200° C. to about $\Delta$100° C. and may thermally link a reflow stage with an underfill stage of process 100. Preventing large temperature fluctuations between reflow and underfill may substantially reduce damage to assembly 120 induced, for instance, by CTE mismatch between IC 101 and substrate 103.

In a particular embodiment, if an process 100 occurs on an assembly line (not shown) and the line experiences interruptions, assemblies 120 may be maintained at temperatures at or above 120° C. until a downstream line interruption is cleared and the assembly line is running again. Maintaining the temperature of assemblies 120 at or above 120° C. may prevent line interruptions from destroying assemblies 120 by preventing assemblies 120 from cooling significantly before an underfill stage of process 100. Such cooling (for instance, to room temperature) may cause severe solder joint 121 and ILD 122 damage, especially, if it occurs before a protective underfill material has been applied.

In a particular embodiment, process 100 may proceed to block 116 where underfill 124 may be applied to assembly 120 between IC 101 and substrate 103 to protect and stabilize FLI 107 of assembly 120. According to a particular embodiment, underfill 124 may comprise a variety of materials, such as, for instance, an epoxy polymer, with or without filler such as ceramic material and/or silica and claimed subject matter is not limited in this regard. According to a particular embodiment, underfill 124 may be applied by a variety of filling techniques, such as, for instance, capillary underfill, needle injection and/or corner dot underfill and claimed subject matter is not limited in this regard.

In a particular embodiment, process 100 may proceed to block 118 where underfill 124 may be partially cured. According to a particular embodiment, underfill 124 may be cured to a gelling phase, such that underfill 124 may protect the solder joint 121 and underlying ILD 122 prior to returning to room temperature. According to a particular embodiment, partial curing may take place at a temperature of about 170° C. until underfill gelling occurs.

In a particular embodiment, process 100 may proceed to block 130 where assembly 120 may be cooled to room temperature. In a particular embodiment, such cooling may occur passively, for instance while assembly 120 is being unloaded off a process 100 assembly line and/or stored prior to a subsequent process 100 stage. However, this is merely an example of a method of cooling assembly 120 and claimed subject matter is not limited in this regard. For instance, assembly 120 may be actively cooled while waiting on-line to move to a subsequent process 100 stage.

In a particular embodiment, process 100 may proceed to block 132 where underfill 124 may be completely cured. According to a particular embodiment, underfill 124 may be cured to at a temperature in the range of 170° C. Full curing of underfill 124 may enable protection of protect solder joint 121 and underlying ILD 122 of FLI 107. However, this is merely an example of a method of curing underfill 124 and claimed subject matter is not so limited. A system comprising operational equipment adapted to carry out process 100 is disclosed in FIG. 2.

Figure 2:
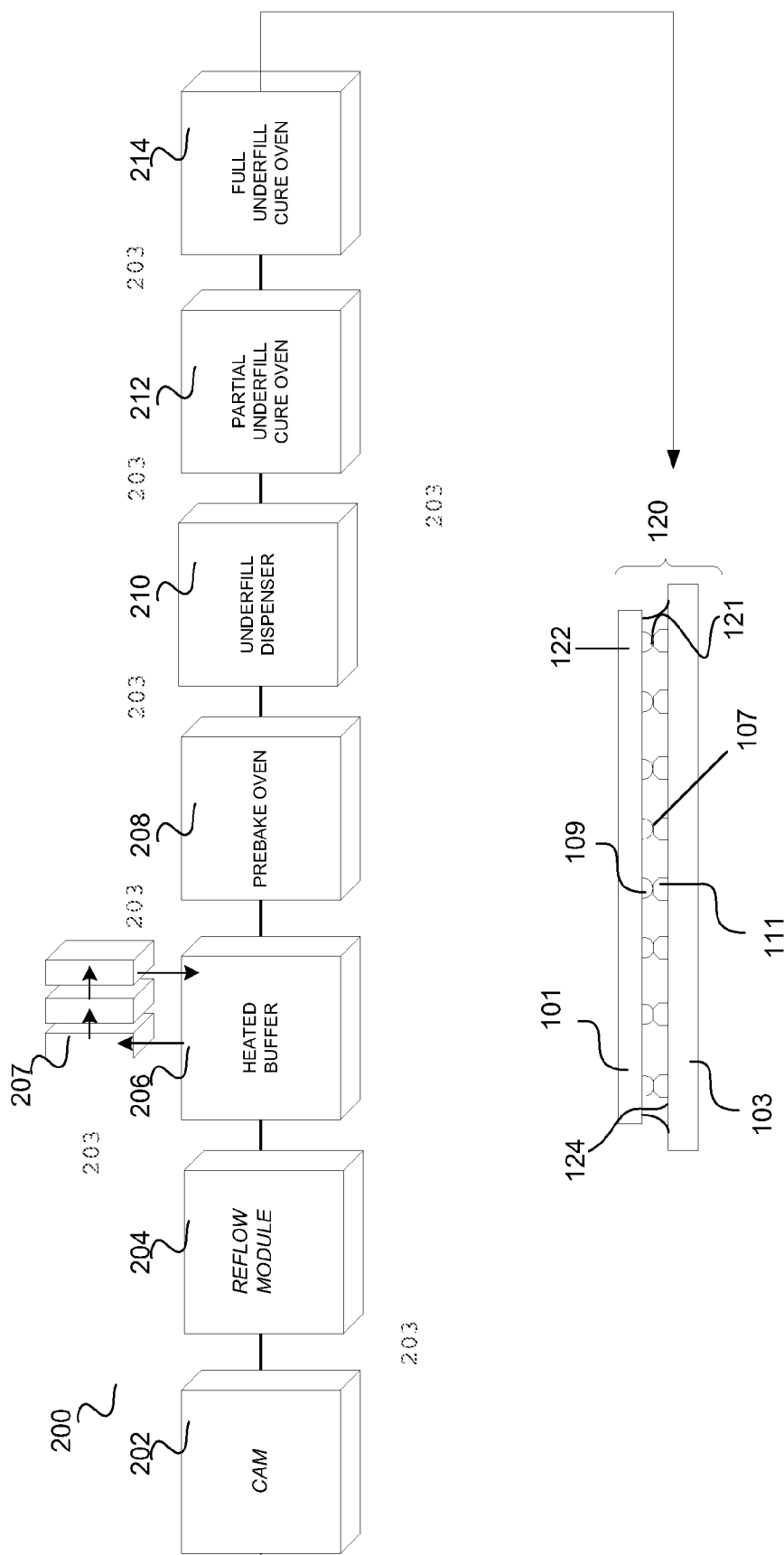
FIG. 2 is a block diagram depicting a particular embodiment of a system for attaching an IC to a package substrate.

FIG. 2 is a block diagram illustrating a particular embodiment of a system 200 for producing assembly 120 via process 100. In a particular embodiment, system 200 may comprise various pieces of operational equipment capable of performing various stages of process 100. Also shown is assembly 120 produced by system 200. In a particular embodiment, system 200 may comprise a single production line, batch equipment or may be a combination of online and batch equipment and claimed subject matter is not limited in this regard.

In the following example embodiment, assembly 120 proceeds from one piece of operational equipment to the next via conveyorized connection 203. However, in other embodiments of system 200, assembly 120 may move from one stage of process 100 to the next by a variety of methods, such as, by being manually moved and claimed subject matter is not limited in this regard.

In a particular embodiment, system 200 may begin after solder bumps 111 have been formed on substrate 103. According to a particular embodiment, chip-attach module (CAM) 202 may be capable of applying flux material, such as, for instance, no-clean flux 105 (shown in FIG. 1) to a first surface of substrate 103 by a variety of methods, such as, by brushing, screen-printing, dipping and/or spraying and claimed subject matter is not limited in this regard. According to a particular embodiment, CAM 202 may be adapted to pick and place IC 101 over substrate 103 to enable alignment of metal bumps 109 with solder bumps 111 of substrate 103. Such alignment may be maintained by a variety of methods such as self-alignment and/or thermocompression and may be facilitated by the presence of flux on substrate 103. In a particular embodiment, no-clean flux, for instance, may aid adhesion of IC 101 to substrate 103.

In a particular embodiment, assembly 120 may proceed to reflow module 204 where IC 101 may be electrically connected to substrate 103 by soldering. In a particular embodiment, assembly 120 may proceed from CAM 202 to reflow module 204 via conveyorized connection 203. Additionally, CAM 202 may be thermally and/or mechanically linked to reflow module 204 via conveyorized connection 203. Such a conveyorized connection may comprise a variety of configurations including belts and/or rollers and may or may not be covered and claimed subject matter is not limited in this regard.

According to a particular embodiment, reflow module 204 may be adapted to apply heat to assembly 120 to melt solder bumps 111 by a variety of methods. Such methods may include, for instance, passing assembly 120 though a reflow oven such as a pulsed heat, convection and/or vapor phase oven and claimed subject matter is not limited in this regard.

In a particular embodiment, assembly 120 may proceed to heated buffer 206 via conveyorized connection 203. In a particular embodiment, heated buffer 206 may be thermally and/or mechanically linked upstream to reflow module 204 via conveyorized connection 203 and thermally and/or mechanically linked downstream to prebake oven 208 and/or underfill dispenser 210 via conveyorized connection 203.

According to a particular embodiment, heated buffer 206 may be adapted to maintain assembly 120 at or above a constant temperature of, for instance but not limited to >/=120° C. as assembly 120 proceeds from a reflow stage of process 100 to an underfill stage. In high volume manufacturing as many as 5000 assembly 120 units may be produced per hour. In a particular embodiment, reflow module 204 may continuously process assemblies 120 which may be passed through heated buffer 206. However, system 200 may be subject to delays due to a variety of causes such as, downstream back-up at underfill dispenser 210, material replenish downtime and/or lot change over. If delays develop on an assembly 120 production line, heated buffer 206 may buffer assemblies 120 to store and maintain assembly 120 temperature.

According to a particular embodiment, heated buffer 206 may be adapted to load a substantial portion or the entire capacity of reflow module 204 into one or more support elements 207. Such support elements may be adapted to support a substrate, substrate panel, and/or tray of substrates. In a particular embodiment, support elements 207 may be a magazine racks. In a particular embodiment, support elements 207 may be random access first in first out (FIFO) and/or last in first out (LIFO) storage racks and claimed subject matter is not limited in this regard. As noted previously, heated buffer 206 may maintain assemblies 120 at or above a constant temperature for an indefinite period of time. In a particular embodiment, heated buffer 206 may be adapted to begin dispensing assemblies 120 from support elements 207 when a back-up on assembly 120 production line is cleared. Thus, heated buffer 206 may reduce the risk of damage to ILD 121 and solder joints 122 by preventing unintended thermal cycling. Additionally, the storage capacity of heated buffer 206 may enable system 200 to continue functioning even when there are downstream interruptions or delays and may reduce the risk of damage to assemblies 120 due to CTE mismatch during such delays.

In a particular embodiment, assembly 120 may proceed to an optional prebake stage in prebake oven 208 via conveyorized connection 203. In a particular embodiment a prebake oven may drive excess moisture or residue off of assembly 120. However, in another particular embodiment a prebake stage may be eliminated. In such an embodiment, assembly 120 may proceed directly to underfill dispenser 210 from heated buffer 206 via conveyorized connection 203.

In a particular embodiment, underfill dispenser 210 may be adapted to apply an underfill material to assembly 120 between IC 101 and substrate 103. According to a particular embodiment, underfill 124 may be applied by a variety of filling techniques, such as, for instance, capillary underfill, needle injection and/or corner dot underfill and claimed subject matter is not limited in this regard.

In a particular embodiment, assembly 120 may proceed to partial underfill cure oven 212 adapted to partially cure underfill 124 via conveyorized connection 203. Such partial curing may result in hardening of underfill 124 such that it is capable of providing protection to ILD 121 and solder joints 122 as assembly 120 returns to room temperature. In a particular embodiment, a partial cure may cure underfill to just beyond a gelling phase before a complete cure is achieved. According to a particular embodiment, partial curing oven 212 may operate at temperatures in the range of 170° C. However, this is merely an example of a temperature at which a partial underfill cure oven may operate and claimed subject matter is not so limited.

Figure 3:
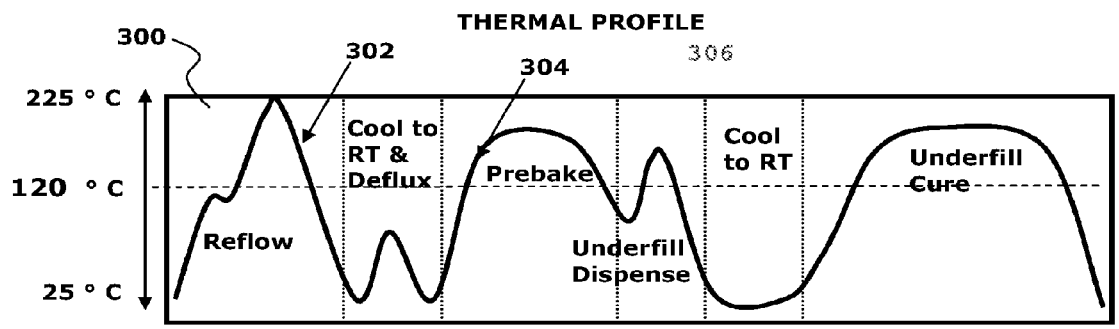
FIG. 3 is a thermal profile of a conventional process to attach an IC to a substrate.

In a particular embodiment, assembly 120 may be cooled to room temperature and assembly 120 may be transported to full underfill cure oven 214 adapted to fully cure underfill 124. In a particular embodiment, assembly 120 may be transported via conveyorized connection 203. In another particular embodiment, underfill cure oven 214 may be off-line and assembly 120 may be transported to underfill cure oven 214 manually. According to a particular embodiment, full underfill cure oven 214 may operate at a temperature in the range of 170° C. However, this is merely an example of a temperature at which a full underfill curing oven may operate and claimed subject matter is not limited in this regard. In FIG. 3 a thermal profile of a conventional packaging process is shown and FIG. 4 depicts a thermal profile of a packaging process according to process 100 for comparison.

FIG. 3 depicts a thermal profile 300 of an IC/substrate assembly as it is assembled in a conventional process including a deflux stage and not including a heated buffer stage. At line segment 302 between reflow and deflux, an IC/substrate assembly may undergo a temperature fluctuation on the order of about 200° C. At line segment 304 between deflux and prebake an IC/substrate assembly may undergo another temperature fluctuation on the order of about 135° C. At line segment 306 between prebake and underfill dispense an IC/substrate assembly may undergo yet another temperature fluctuation on the order of about 60° C. These frequent and large temperature fluctuation especially before underfill, may cause physical damage to fragile ILDs and solder joints due to CTE mismatch.

Figure 4:
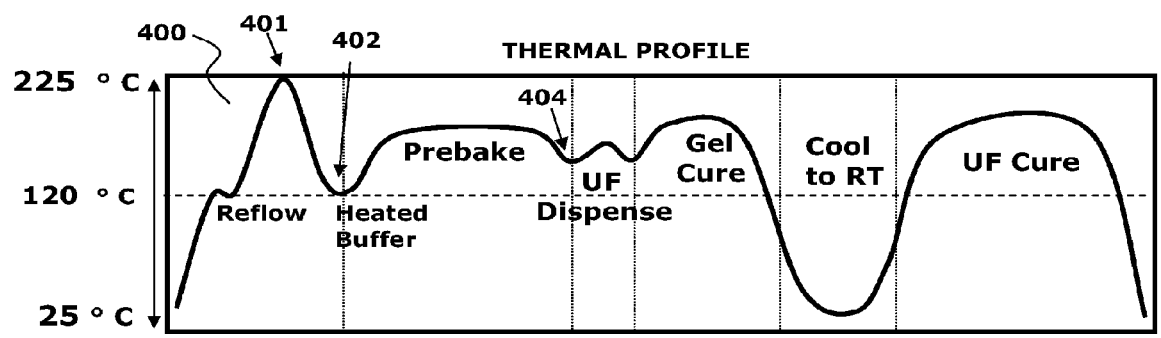
FIG. 4 is a thermal profile of a particular embodiment of process to attach an IC to a substrate.

FIG. 4 depicts a thermal profile 400 of a particular embodiment of an IC/substrate packaging process as described with reference to FIG. 1 comprising a heated buffer stage and not including a deflux step. In contrast to thermal profile 300, at line segment 401-402 before a heated buffering stage there is no deflux step and therefore the temperature fluctuation is about 100° C. rather than 200° C. Thereafter package assemblies may be kept at or above a constant temperature of about 120° C. as they transfer from a heated buffer, to a prebake and then underfill stage from line segment 402 to line segment 404. Thus pre-underfill dispense temperature fluctuations may be substantially reduced minimizing damage to ILDs and solder joints caused by CTE mismatch.

Example 1

IC/substrate assemblies were packaged and examined for defects such as solder cracking and inner layer dielectric delamination using C-mode scanning acoustic microscropy (C-SAM). The experimental assemblies all comprised low-k inner layer dielectric material. Two packaging technologies were tested: packaging according to process 100 and packaging according to conventional methods. Assemblies were packaged with or without integrated heat spreaders (IHS) attached. Examination for defects was conducted before and after temperature shock thermal cycling from about 0° C. to about 160° C. on the order of about 50 cycles. Experimental data reported in Table 1 below shows that defects were detected in over 50.0% of assemblies packaged according to conventional methods using low-k dielectric ILDs while no defects were detected in assemblies packaged according to process 100.

TABLE 1

| Packaging Technology | Defects pre-shock | Defects post-shock |
| --- | --- | --- |
| Process 100-w/o IHS | 0.0% (n = 24) | 0.0% (n = 10) |
| Process 100-w/IHS | 0.0% (n = 36) | 0.0% (n = 12) |
| Conventional-w/o IHS | 66.67% (n = 6) | 66.67% (n = 3) |
| Conventional-w/IHS | X | 58.34% (n = 12) |

While certain features of claimed subject matter have been illustrated as described herein, many modifications, substitutions, changes and equivalents will now occur to those skilled in the art. It is, therefore, to be understood that the appended claims are intended to cover all such embodiments and changes as fall within the spirit of claimed subject matter.

What is claimed is:

1. A method comprising:
   placing an integrated circuit onto a package substrate;
   performing reflow to attach the integrated circuit to the package substrate;
   maintaining the temperature of the integrated circuit and package assembly at or above a predetermined temperature prior to dispensing an underfill between the package substrate and the integrated circuit;
   dispensing an underfill material between the package substrate and the integrated circuit;
   curing the underfill material to a first level of curing in the integrated circuit and package assembly;
   cooling the underfill material in the integrated circuit and package assembly; and
   curing the underfill material to a second level of curing wherein the second level of curing is greater than the first level of curing.

2. The method of claim 1 further comprising prebaking the integrated circuit and package assembly prior to dispensing the underfill material.

3. The method of claim 1, further comprising dispensing a no-clean flux on the substrate prior to performing reflow.

4. The method of claim 3 wherein during reflow the assembly is held at the flux activation temperature for an extended period of time to substantially control the manner of volatilization of the no-clean flux.

5. The method of claim 4 wherein the flux activation temperature is approximately 140° C. and the extended period of time is approximately 100 seconds.

6. The method of claim 1, wherein the predetermined temperature is approximately 120° C.

7. The method of claim 1, wherein temperature fluctuations from performing reflow to dispensing underfill do not exceed approximately 100° C.

8. The method of claim 1 wherein the first level of curing comprises a partial cure and the second level of curing comprises a complete, or nearly complete, cure.

9. The method of claim 1 wherein the assembly is cooled to room temperature after curing the underfill to a first level.

* * * * *